United States Patent [19]

Hamburgen et al.

[11] Patent Number: 5,243,756
[45] Date of Patent: Sep. 14, 1993

[54] INTEGRATED CIRCUIT PROTECTION BY LIQUID ENCAPSULATION

[75] Inventors: William R. Hamburgen, Menlo Park; John S. Fitch, Newark, both of Calif.

[73] Assignee: Digital Equipment Corporation, Maynard, Mass.

[21] Appl. No.: 862,192

[22] Filed: Apr. 2, 1992

Related U.S. Application Data

[63] Continuation of Ser. No. 722,690, Jun. 28, 1991, Pat. No. 5,130,889.

[51] Int. Cl.$^5$ .............................................. H05K 3/00
[52] U.S. Cl. ....................................... 29/841; 29/530; 29/855; 437/212; 437/219; 437/224; 264/272.12
[58] Field of Search .................. 29/841, 530, 855; 264/212.12, 212.13; 427/282, 340; 53/140, 411, 431, 472; 137/212, 219, 224

[56] References Cited

U.S. PATENT DOCUMENTS

| | | | |
|---|---|---|---|
| 4,123,308 | 10/1978 | Nowlin et al. | 156/272 |
| 4,847,731 | 7/1989 | Smolley | 361/385 |
| 4,874,915 | 10/1989 | Harms | 219/10.55 |
| 5,037,779 | 8/1991 | Whalley et al. | 437/219 |
| 5,121,706 | 6/1992 | Nichols et al. | 118/719 |

*Primary Examiner*—Irene Cuda
*Assistant Examiner*—Kenneth J. Hansen
*Attorney, Agent, or Firm*—Flehr, Hohbach, Test, Albritton & Herbert

[57] ABSTRACT

A device for hermetically protecting integrated circuits is disclosed. The device includes a plastic housing which has a cavity. The cavity forms an opening at the top of the housing and extends toward the bottom of the housing where a metallic slug is positioned. The cavity also includes one or more bond shelves descending from the top of the housing toward the bottom of the housing. The bond shelves support conducting bond pads which are coupled to connecting pins which extend from the housing. An integrated circuit with a number of integrated circuit bond pads is attached by an epoxy to the bottom of the cavity. Bond wires couple the integrated circuit bond pads and the bond shelf pads. A liquid is dispensed in the cavity such that the liquid extends from the bottom of the cavity to a position above the bond wires. A properly selected liquid provides protection for the integrated circuit and its electrical connections. In addition, the low viscosity of the liquid substantially prevents stress on the bond wires. To confine the liquid and prevent void formation, a coating is positioned over the exposed region of the liquid. A cover may be positioned over the cavity to further protect the integrated circuit.

16 Claims, 1 Drawing Sheet

INTEGRATED CIRCUIT PROTECTION BY LIQUID ENCAPSULATION

This is a continuation of application Ser. No. 07/722,690 filed Jun. 28, 1991, now U.S. Pat. No. 5,130,889.

BRIEF DESCRIPTION OF THE INVENTION

This invention relates to the protection of integrated circuits in non-hermetic packages. More particularly, this invention relates to a non-hermetic package in which the integrated circuit is protected by encapsulating it in a liquid which is confined by a coating.

BACKGROUND OF THE INVENTION

The traditional approach to protecting relatively complex integrated circuits (ICs) is to package them in multilayer ceramic packages. There are a number of problems associated with this approach. These packages are expensive, they take a long time to tool, and they generally have poor electrical performance.

Many of these problems are addressed by recently developed Plastic Pin Grid Array (PPGA) packages. PPGAs enjoy a number of benefits over ceramic packages: they are relatively inexpensive, they may be quickly and inexpensively tooled, and they have excellent electrical performance.

The primary problem with PPGAs, which has slowed their wide acceptance, is their lack of hermeticity. That is, unlike metal, glass, or ceramic materials, they do not form a complete barrier to moisture and gases. Consequently, they tend to be less reliable than hermetic packages. This problem is especially pronounced in non-computer room environments where the air may have a high humidity or high ionic content.

To achieve the required protection of an IC in a PPGA, a number of solutions have been proposed. These solutions include placing a coated gel over the IC. It is widely recognized that a thick and adherent gel provides protection for the surface of an IC. However, there are problems associated with this approach. Specifically, most gels have much higher expansion coefficients than the IC. As a result, during temperature cycling, the encapsulants tend to rip bond wires off the bond pads of the IC.

SUMMARY OF THE INVENTION

This invention relates to a device for protecting integrated circuits. The device includes a plastic housing which has a cavity. The cavity forms an opening at the top of the housing and extends toward the bottom of the housing where a metallic slug is positioned. The cavity also includes one or more bond shelves descending from the top of the housing toward the bottom of the housing. The bond shelves support conducting bond pads which are coupled to connecting pins or other leads which extend from the housing. An integrated circuit with a number of bond pads is attached to the bottom of the cavity. Bond wires couple the integrated circuit bond pads and the bond shelf pads. A liquid is dispensed into the cavity such that the liquid extends from the bottom of the cavity to a position above the bond wires. A properly selected liquid provides protection for the integrated circuit and its electrical connections. In addition, the use of a liquid rather than a solid encapsulant substantially prevents stress on the bond wires. To confine the liquid and prevent void formation during temperature excursions, a flexible solid coating is positioned over the exposed region of the liquid. A cover may be positioned over the cavity to further protect the integrated circuit.

DETAILED DESCRIPTION OF THE INVENTION

Figure 1:
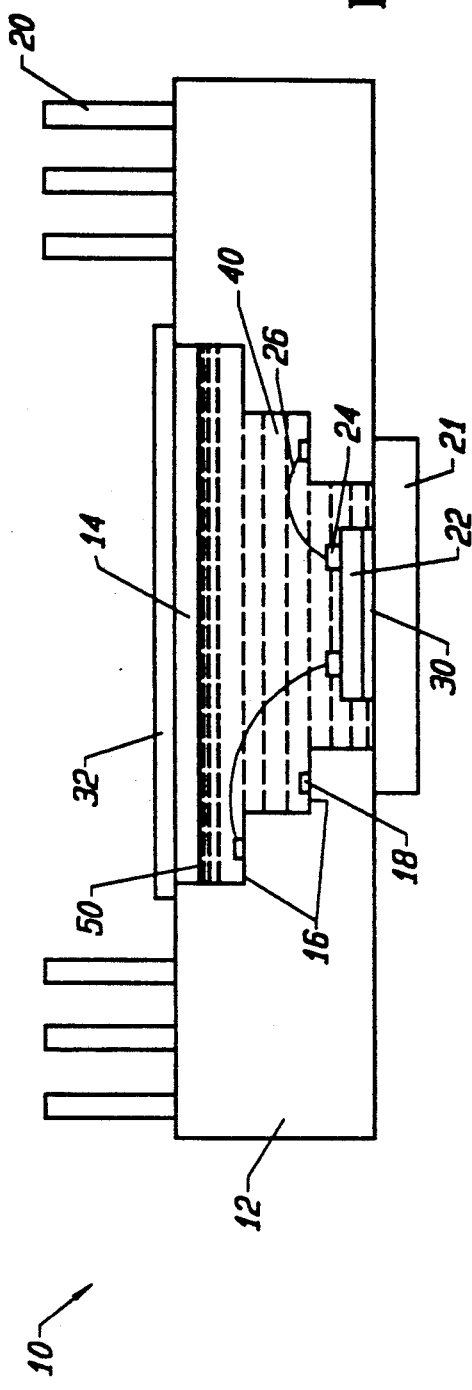
FIG. 1 is a side view of an IC protected by liquid encapsulation, in accordance with the present invention.

Turning now to the drawings, wherein like components are designated by like reference numerals in the various figures, attention is initially directed to FIG. 1 which depicts an integrated circuit (IC) package 10. The present invention is most feasibly utilized in conjunction with a Plastic Pin Grid Array (PPGA); PPGAs are well-known in the art. The IC package 10 includes a housing 12. A cavity 14 is formed within the housing. The cavity includes one or more bond shelves 16 which descend from the top of the cavity toward the bottom of the cavity. Each bond shelf includes a bond shelf pad 18. In accordance with prior art techniques, each bond shelf pad 18 is electrically coupled to a connecting pin 20 or other lead, such as a gull-wing lead, as used in surface mount devices. As is known in the art, the pins are then used to connect the IC package 10 to a circuit board.

At the bottom of cavity 14, a metallic slug 21 is positioned. The slug 21 may be copper or another substance commonly used in the art. An Integrated Circuit (IC) 22 is secured to the slug 21; the attachment may be achieved through soldering or by using an adhesive, silver filled epoxy is commonly used. The IC 22 includes a number of IC bond pads 24. The IC bond pads 24 are coupled to bond shelf pads 18 by bond wires 26. For mechanical protection, the cavity ay be closed with a cover 32.

As is known in the art, there are problems associated with this configuration. Specifically, when a plastic housing 12 is employed, moisture eventually migrates into the cavity. This moisture accumulates on the bond shelf pads 18 and IC pads 24. If any ionic contaminants are present, the moisture results in corrosion and eventually disrupts the electrical performance of the IC 22. This problem is especially acute when the IC package 10 is utilized in a harsh environment.

Prior art attempts to solve this problem have resulted in attempts to encapsulate the IC 22 in a gel. As used herein, the term "encapsulate" means to surround portions of the IC 22 which are not directly attached to the housing 12.

Encapsulating the IC 22 in a gel creates its own problems. While gels can provide good protection, because of their rigidity and high expansion coefficient, they tend to rupture the connections of the bond wires 26. This rupturing most commonly occurs during temperature cycling, since the coefficient of expansion of the gel is much greater than that of the components which it abuts.

This problem is solved by the teachings of the present invention. In accordance with the invention, a liquid 40 is dispensed into cavity 14. The viscosity of the liquid 40 is low enough that it will not produce undue stress on the bond wires 26. Consequently, the liquid provides the desired protection but will not result in the rupturing of bond wires 26.

One problem associated with this solution is sealing the liquid encapsulant 40 so that during temperature cycling the liquid's expansion can be accommodated without voids of vapor forming. A void may form over the IC surface and thereby eliminate the protective function of the liquid 40.

To prevent void formation, the fluid enclosure should be able to change in volume along with the fluid. For a typical operating range of −40° C. to 66° C., the fluid enclosure should be able to accommodate a change in volume of approximately 10%.

In addition to preventing void formation, when using the liquid 40, accommodation should be made such that fluid pressure changes do not produce undue stress on, the bond wires 26 or other components, for instance die attachments or metal traces. These problems may be solved by utilizing an elastomer bellows or diaphragm above the liquid. The substantial disadvantage of this approach is that it is expensive to fabricate and assemble a bellows or diaphragm mechanism. In addition, it is difficult to properly fill and seal the fluid enclosure.

These difficulties are solved in accordance with the present invention which utilizes a flexible solid ,coating 50 to locally seal a liquid 40 within the cavity 14. The viscosity of the liquid 40 will reduce stress on bond wires 26 and other components. The coating 50 will reduce the likelihood of voids forming and will not result in pressure changes which produce undue stress on the bond wires 26 and other components.

Having disclosed the general nature of the present invention and its advantages, attention presently focuses upon particular technical details associated with the invention. As used herein, a liquid is distinguished from a prior art gel in that it has a viscosity which can be measured. More particularly, a liquid 40, in accordance with the invention, has a viscosity of between 0 and 24 million centipoise. Thus, for the purposes of this document, "low viscosity" is defined as viscosity less than or equal to 24 million centipoise. Preferably, the viscosity of the liquid will be between 0 and 1 million centipoise.

A suitable liquid to be used in accordance with the invention would be perfluoropolyether one of the Krytox fluids, manufactured by DuPont. A silicone liquid, such as those manufactured by Dow-Corning may also be employed. The liquid will preferably have a vapor pressure below 1 mTorr. The pour point of the liquid will preferably be less than −40° C.

The liquid may be dispensed into the cavity 14 by a pipette or any other suitable means, such as spraying. It may be advantageous to degas the liquid prior to dispensing in order to prevent subsequent formation of bubbles.

In accordance with the invention, the coating 50 may be formed from "parylene", a nearly transparent polymer material developed by Union Carbide Corporation. More particularly, parylene N may be used in accordance with the invention. The parylene is deposited on the exposed region of the liquid 40; that is, that portion of the liquid which is not confined by the housing 12.

As is known in the art, parylene is vacuum-deposited in thin, controlled thicknesses at room temperature. Parylene exhibits chemical purity, high dielectric strength in thin layers, and controlled thickness, accurate to fractions of a mil.

As is known in the art, the parylene deposition process may be achieved by using a vaporizer, a pyrolysis device, a deposition chamber, a cold trap and a vacuum pump arranged in series. By way of example, parylene deposition may begin with vaporization at 50° C. and 1 Torr of negative pressure. Monomer conversion occurs at 680° C. and 0.5 Torr of vacuum in the second processing phase, and final deposition takes place at approximately 25° C. and a negative pressure of 0.1 Torr. The cold trap between the generator and the vacuum pump condenses and collects free polymer vapor.

A further advantage of utilizing parylene is that it coats all surfaces of the IC package 10 and thus improves the corrosion resistance of the IC package 10. However, as is known in the art, it is necessary to ask the pins 20 and possibly the slug 21 prior to the parylene deposition process. A demasking procedure is invoked after the deposition process.

Other thin and flexible coatings may also be deposited on top of liquid 40. For instance, a metal, such as gold, can be evaporated onto the liquid 40. Spraying an epoxy onto the liquid 40 is also a feasible approach.

An alternate approach for forming a coating 50 on the liquid 40 will be denominated herein as the surface cure process. In this approach, the surface of the liquid 40 is utilized to form the coating 50. This may be accomplished through any number of feasible techniques. For instance, the surface of liquid 40 may be exposed to radiation with a wavelength which the liquid 40 strongly absorbs. Ultraviolet radiation with a wavelength of approximately 2000 Angstroms would be suitable for this purpose. Exposure to the radiation will result in the formation of a coating 50 on the liquid 40. The formation of a coating 50 could also be achieved by spraying a catalyst or curing agent onto the surface of the liquid 40 to promote curing at the surface.

Figure 2:
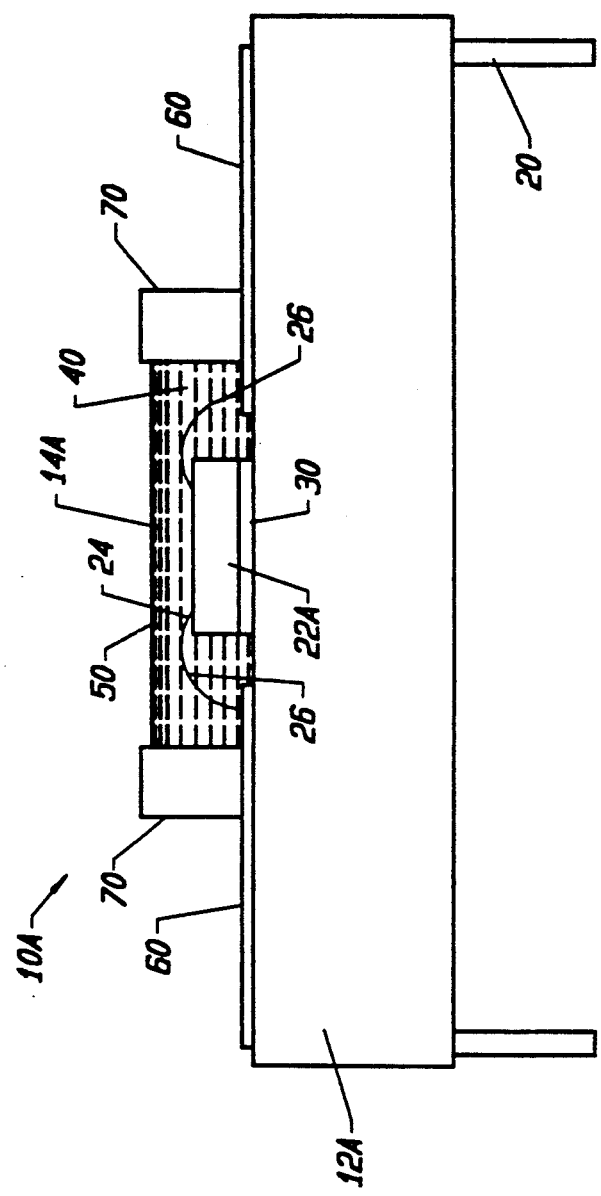
FIG. 2 is side view of an IC protected by liquid encapsulation, in accordance with an alternate embodiment of the present invention.

FIG. 2 depicts an alternate embodiment of an IC package 10A constructed in accordance with the present invention. Housing 12A is a simplified device commonly used with a low-power IC 22A. In this embodiment, the IC 22A is directly attached to the housing 12A, for instance, by epoxy 30. The bond wires 26 are coupled to leads 60 which are positioned on the exterior of the housing 12A. The leads 60 are coupled to- pins 20 in accordance with prior art techniques. In this embodiment, the IC 22A ay be protected by placing walls 70 around the IC 22A. The walls 70 form a cavity 14A. The cavity 14A may then serve to contain liquid 40 upon which coating 50 is formed.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. For instance, the principles of the invention are fully applicable to a device in which slug 21 is positioned on the same side of the IC package 10 as the pins 20. In this embodiment, cavity 40 would include bond shelves 16 descending ,toward the pin side of the IC package 10. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

We claim:

1. A method for protecting integrated circuits positioned within a cavity of a housing, said method comprising the steps of:
    masking portions of said housing to form masked housing regions and unmasked housing regions;
    dispensing a liquid within said cavity, said dispensing step followed said masking step;
    forming a parylene coating on an exposed region of said liquid and said unmasked housing regions so as to confine said liquid within said cavity; and
    de-masking said masked housing regions after said forming step.

2. The method of claim 1 further comprising the step of:
    positioning a lid over said cavity, after said forming step.

3. A method of protecting an integrated circuit positioned at the base of a cavity of a housing, said integrated circuit being coupled to said housing by a plurality of bond wires, said method comprising the steps of:
    dispensing a liquid within said cavity so as to encapsulate said integrated circuit and to contact at least a portion of said bondwires; and
    forming a resilient coating on an exposed region of said liquid, said coating extending over said liquid and attaching to said housing so as to confine said liquid within said cavity and to expand with changes in liquid volume produced during temperature cycling without displacing said bond wires.

4. The method of claim 3 wherein said forming step includes forming a parylene coating on said exposed region of said liquid.

5. The method of claim 3 wherein said forming step includes curing said liquid surface to form a solid, flexible coating.

6. The method of claim 5 wherein said surface cure process of said forming step is selected from the processes consisting of: an ultraviolet radiation process, a catalyst application process, and a curing agent application process.

7. The method of claim 3 wherein said dispensing step includes dispensing silicone liquid within said cavity.

8. The method of claim 3 wherein said dispensing step includes dispensing perfluoropolyether liquid within said cavity.

9. The method of claim 3 further comprising the steps of:
    masking portions of said housing prior to said dispensing step; and
    de-masking said masked portions of said housing after said forming step.

10. A method of protecting an integrated circuit positioned at the base of a cavity of a housing, said integrated circuit being coupled to said housing by a plurality of bond wires, said method comprising the steps of:
    dispensing a liquid within said cavity so as to encapsulate said integrated circuit and to contact at least a portion of said bondwires, said dispensed liquid having a vapor pressure below 1 mTorr to substantially avoid vapor formation at temperature within an expected operating range, said dispensed liquid having an exposed surface distal said encapsulated circuit; and
    forming a resilient coating on said exposed surface of said liquid, said coating extending over said liquid and attaching to said housing so as to confine said liquid within said cavity and to expand with changes in liquid volume produced during temperature cycling without displacing said bond wires.

11. The method of claim 10 wherein said forming step includes forming a parylene coating on said exposed surface of said liquid.

12. The method of claim 10 wherein said forming step includes curing said liquid surface to form a solid, flexible coating.

13. The method of claim 12 wherein said surface cure process of said forming step is selected from the processes consisting of: an ultraviolet radiation process, a catalyst application process, and a curing agent application process.

14. The method of claim 10 wherein said dispensing step includes dispensing silicone liquid within said cavity.

15. The method of claim 10 wherein said dispensing step includes dispensing perfluoropolyether liquid within said cavity.

16. The method of claim 10 further comprising the steps of:
    masking portions of said housing prior to said dispensing step; and
    de-masking said masked portions of said housing after said forming step.

* * * * *

UNITED STATES PATENT AND TRADEMARK OFFICE
CERTIFICATE OF CORRECTION

PATENT NO. : 5,243,756
DATED : September 14, 1993
INVENTOR(S) : William R. Hamburgen et al.

It is certified that error appears in the above-identified patent and that said Letters Patent is hereby corrected as shown below:

Column 5,
Line 8, delete "followed" and insert therefor -- following --
Line 10, after "regions" delete -- so as --
Line 17, after "cavity" delete the comma Signed and Sealed this Fourteenth Day of June, 2005

JON W. DUDAS
*Director of the United States Patent and Trademark Office*